United States Patent [19]
Storino et al.

[11] Patent Number: 5,973,971
[45] Date of Patent: Oct. 26, 1999

[54] DEVICE AND METHOD FOR VERIFYING INDEPENDENT READS AND WRITES IN A MEMORY ARRAY

[75] Inventors: Salvatore Nicholas Storino; Gregory John Uhlmann, both of Rochester, Minn.

[73] Assignee: International Business Machines Corporation, Armonk, N.Y.

[21] Appl. No.: 09/002,341

[22] Filed: Jan. 2, 1998

[51] Int. Cl.$^6$ .................................................. G11C 29/00
[52] U.S. Cl. ..................................... 365/201; 365/189.07
[58] Field of Search .............................. 365/201, 189.07, 365/221, 154, 230.05; 371/21.2, 21.1

[56] References Cited

U.S. PATENT DOCUMENTS

| | | | |
|---|---|---|---|
| 5,404,332 | 4/1995 | Sato et al. ................................. | 365/201 |
| 5,424,988 | 6/1995 | McClure et al. ......................... | 365/201 |
| 5,742,557 | 4/1998 | Gibbins et al. .......................... | 365/201 |

*Primary Examiner*—Tan T. Nguyen
*Attorney, Agent, or Firm*—Lawrence D. Maxwell; Brown, Martin, Haller & McClain

[57] ABSTRACT

A device and method for verifying independent reads and writes in a memory array includes bit inserters in the array to simultaneously insert a predetermined value into multiple portions of the array. Each row may have a corresponding row bit inserter. Alternatively, or in addition, each memory cell may have a storage element bit inserter. A row bit inserter places a predetermined value at the inputs of a row write port. The storage element bit inserters pre-set memory cells to a predetermined value. To test the read circuitry, storage element bit inserters are set to a predetermined value, and a read is performed. If the value read from a memory cell does not match the value to which it was set, it can be inferred that the read circuitry is not functioning properly. If the values match, it can be inferred that the read circuitry is functioning properly. To test the write circuitry, a row bit inserter may be set to a predetermined value. A write is performed, followed by a read. If the value read from a memory cell matches the value to which the row bit inserter was set, it can be inferred that the write circuitry is functioning properly. If the values do not match, and if it has already been determined that the read circuitry is functioning properly, it can be inferred that the write circuitry is not functioning properly.

21 Claims, 8 Drawing Sheets

DEVICE AND METHOD FOR VERIFYING INDEPENDENT READS AND WRITES IN A MEMORY ARRAY

BACKGROUND OF THE INVENTION

1. Field of the Invention

The present invention relates to a general purpose register or memory array having devices for testing the memory cells.

2. Description of the Related Art

Memory arrays, like other electronic circuit components, are susceptible to manufacturing defects and failure. Memory arrays are typically fabricated on an integrated circuit chip, which may be a dedicated memory chip or may include other circuit components. Defects in a memory array may be caused by fabrication errors or improper handling. Environmental factors, age or improper use can cause a memory array to fail at any time.

The susceptibility of memory arrays to manufacturing defects and failure has prompted the development of means for testing them. One such means, which is sometimes referred to as functional testing, involves writing one or more data patterns to the memory array, then reading the data patterns from the memory array, and comparing the patterns written to the patterns read. A discrepancy indicates a defect or failure. Such functional testing has the advantage of requiring no components dedicated to the testing function to be included in the chip. An additional advantage is that each bit can be tested independently. The primary disadvantage of functional testing is that it is relatively slow, since the chip is operated in its normal manner over the entire memory array. Furthermore, the read port circuitry is not tested independently of the write port circuitry. Isolating the cause of the discrepancy between the data written and the data read may be impossible because the discrepancy could have been caused by the write port, the read port, the memory cell storage element, or a combination of these components.

Another testing means involves incorporating into the chip built-in-self-test (BIST) circuitry. A BIST is thorough because it tests each and every memory cell. Such testing granularity is highly desirable. A BIST can also test a memory array reasonably rapidly because it exercises the memory cells directly. The primary disadvantage of BIST is that its components take up a significant amount of space or real-estate on the chip. The extra components also undesirably increase signal loading.

It would be desirable to provide a memory array testing device and method that includes some of the advantages of both BIST testing and functional pattern testing. These problems are satisfied by the present invention in the manner described below.

SUMMARY OF THE INVENTION

The present invention relates to a device and method for verifying independent reads and writes in a memory array in which bit inserters included in the array are used to simultaneously set multiple portions of the array to a predetermined value. The term "memory array" as used in this patent specification is intended to include within its scope all types of memory arrays, including general purpose storage registers. The memory array is arranged, at least conceptually if not physically, as rows and columns of memory cells. Each row has a row write port that is coupled to the memory cell of each column of that row. The terms "row" and "column" are used for convenience and do not designate any particular orientation or data word definition; rather, they are merely convenient names for first and second dimensions of the array. The rows may be equivalently described as a columns and vice versa. In addition, each memory cell has a storage element, a bit write port, and a bit read port.

Each row may have a corresponding row bit inserter coupled to the input of each row write port. The control inputs of the row bit inserters are coupled together to control them simultaneously. Setting the row bit inserter control inputs to a predetermined value thus places a predetermined value at the inputs of all of the row write ports. The value may represent either a high or low logic level. Suitable transistor circuitry may be included to generate this logic level in response to the control input. This circuitry may generate a fixed logic level or a selectable logic level. Performing a write operation to the column in the conventional manner then writes this value to the memory cells of the column.

In addition or alternatively, each memory cell may have a storage element bit inserter. The control inputs of the storage element bit inserters if a column are coupled together to control them simultaneously. Setting the storage element bit inserter control inputs of a column to a predetermined value thus places a predetermined value in the bit storage elements of that column. The value may represent either a high or low logical level. Suitable transistor circuitry may be included to generate this logic level in response to the control input. This circuitry may generate a fixed logic level or a selectable logic level. Performing a write operation to the column in the conventional manner then writes this value to the memory cells of the column.

A method for testing the memory array using the above-described bit inserter circuitry may include the step of setting the storage element bit inserter control inputs of a column to a predetermined value. As a result, a value is stored in the storage elements of the memory cells of that column. A read operation is then performed on the column. If the value read from a memory cell of the column does not match the value to which the storage element bit inserters were set, it can be inferred that either the storage element itself and/or the bit read port is not functioning properly because the bit value was directly inserted into the storage element by the storage element bit inserter, bypassing the bit write port. If the values match, it can be inferred that both the storage element and the read port are functioning properly.

In addition or alternatively to these steps, the method may include testing the bit write port. The row bit inserter control inputs of a column are set to a predetermined value. A write operation is then performed on a column, followed by a read operation. If the value read from a memory cell of the column matches the value to which the row bit inserters were set, it can be inferred that the bit port is functioning properly. If the values do not match, and if it has been determined by the above-described test that the storage element and read port are functioning properly, then it can be inferred that the bit write port is not functioning properly.

In comparison to conventional BIST, the present invention requires relatively little chip real-estate to incorporate into an existing memory array design, an advantage provided in the prior art only by functional testing methods. Moreover, the present invention can exercise every memory cell of the array, an advantage provided in the prior art by conventional BIST but only at the cost of significant chip real-estate.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 1:
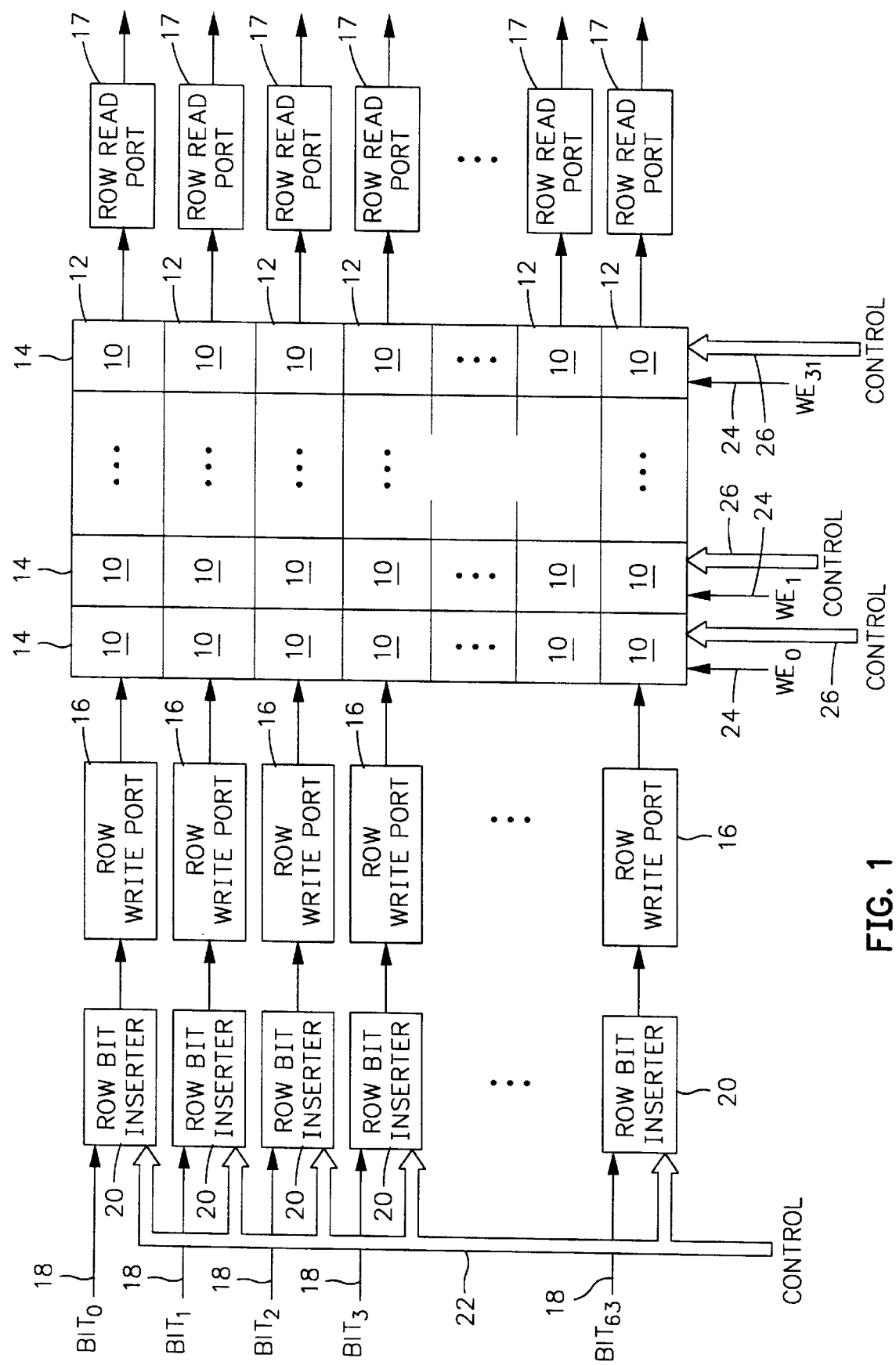
FIG. 1 is a schematic diagram of a memory array having bit inserters for testing read and write operations independently of one another.

As illustrated in FIG. 1, a memory array includes memory cells 10 arranged as rows 12 and columns 14. Although each row 12 and each column 14 may have any suitable number of memory cells 10, each preferably has at least two, as in a conventional memory array. For illustrative purposes, the exemplary memory array has 64 rows 12 and 32 columns 14. The memory array is 35 preferably formed on a suitable integrated circuit chip. The chip may be a dedicated memory chip or a chip having more diverse functions, one of which is the storage of data. Each row 12 has a corresponding row write port 16 and row read port 17. Each row write port 16 and row read port 17 may be of conventional design and is coupled to each memory cell 10 of its corresponding row 12.

The memory array includes 64 bit lines 18, each corresponding to one of rows 12. In a conventional memory array, each bit line 18 would be directly coupled to the input of the row write port 16 of its corresponding row. In the illustrated embodiment of the present invention, however, each bit line 18 is coupled to the input of a row bit inserter 20, which is in turn coupled to the input of the row write port 16 of its corresponding row. Each row bit inserter 20 of a column 14 has a control input coupled to the control input of all other row bit inserters 20 of that column 14 and to one or more row bit inserter control signals 22, as described in further detail below with respect to FIGS. 5–7. Control signals 22 thus control all row bit inserter 20 of a column 14 simultaneously. Setting control signals 22 as described below places a predetermined logic level or value at the inputs of all row write ports 20. (As described below, the logic level is "predetermined" in the sense that it is determined in response to a predetermined or predefined value or combination of values of bit inserter control signals 22.) All memory cells 10 of each column 14 receive a corresponding write enable signal 24. As described below with respect to a method for testing the memory array, performing a write operation to a column 14 by asserting the corresponding write enable signal 24 writes the value placed at the inputs to row write ports 20 to the memory cells 10 of that column 14.

All memory cells 10 of a column 14 also receive one or more corresponding storage element bit inserter control signals 26. Setting control signals 26 as described below sets each memory cell 10 of the corresponding column 14 to a predetermined logic level or value, as described below. In other words, each of control signals 26 controls all memory cells 10 of its corresponding column simultaneously.

Figure 2:
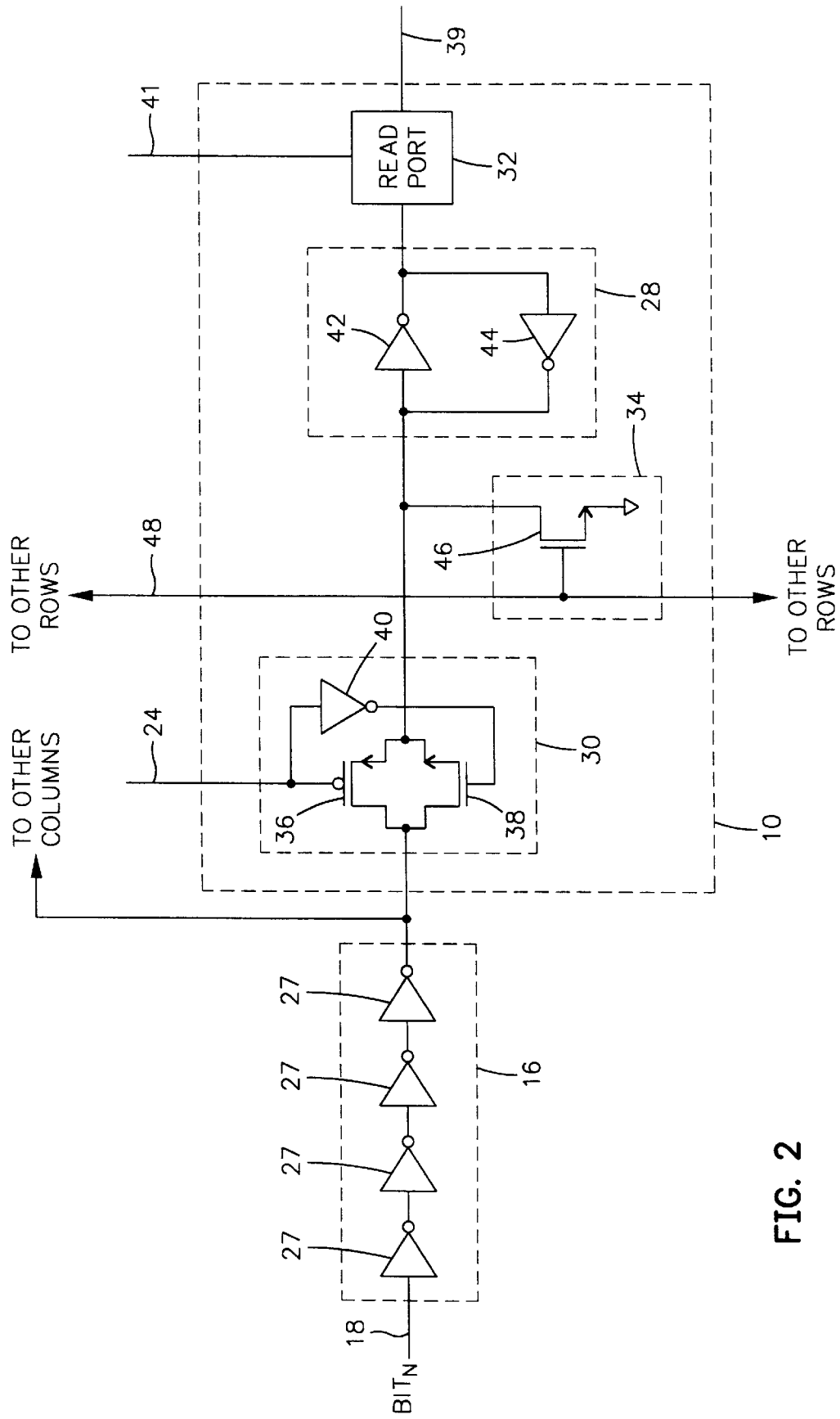
FIG. 2 is a schematic diagram of a memory cell having a storage element bit inserter for pre-setting the storage element of the memory cell to a low logic state.

As illustrated in FIG. 2, the output of a row write port 16 of a given row 12 is coupled to the bit input of a memory cell 10 and, though not shown in FIG. 2, memory cells 10 of all other columns 14 of that row 12. Row write port 16 is illustrated as including four inverters 27, representing the delay needed to provide write hold time, but this representation is only intended to be illustrative, and any suitable write port circuitry may be included. Memory cell 10 includes a storage element 28, a bit write port 30, a bit read port 32, and a storage element bit inserter 34.

Bit write port 30 may be of any suitable design. For illustrative purposes, it may be of the generally conventional design that includes a P-channel field-effect transistor (PFET) 36, a N-channel field-effect transistor (NFET) 38, and an inverter 40. One of write enable signals 24 is provided to PFET 36, and its complement is provided to NFET 38 via inverter 40. Bit read port 32 may similarly be of any suitable design and is therefore not described in detail.

Nevertheless, data stored in storage element 28 is provided at an output 39 in response to a read enable signal 41. Storage element 28 includes two inverters 42 and 44 arranged in a generally conventional manner with respect to read and write ports 30 and 32.

Storage element bit inserter 34 includes a NFET 46, the gate terminal of which is coupled to a control signal 48, which is one of the storage element bit inserter control signals 26 of this embodiment. Though not shown in FIG. 2, that same control signal 48 is coupled to the storage element bit inserter 34 of all other rows 12 of that column 14. The source terminal of NFET 36 is coupled to ground, and the drain terminal is coupled to storage element 28. Thus, asserting control signal 48 sets storage element 28 to ground, which represents a low logic level or binary "0".

Figure 3:
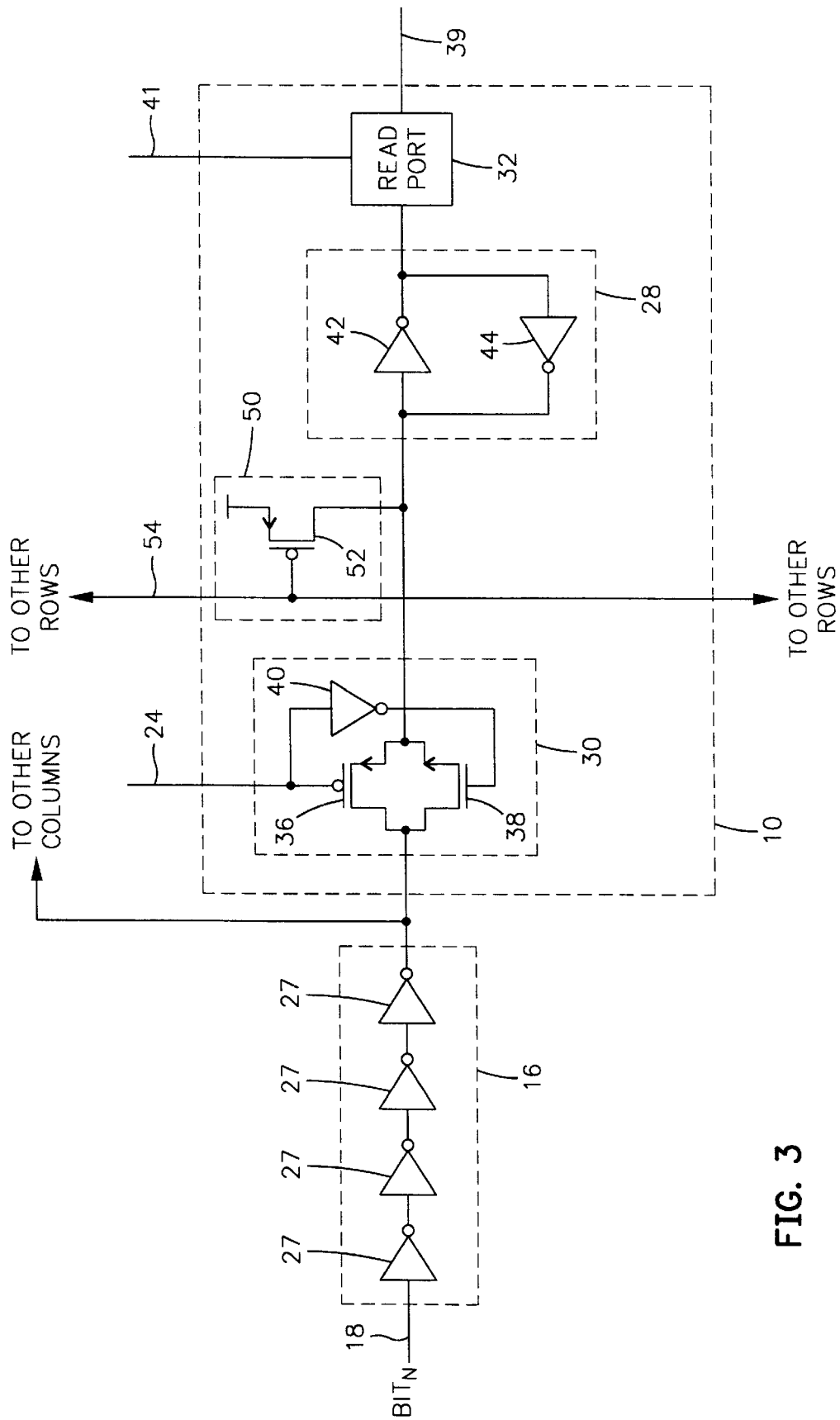
FIG. 3 is a schematic diagram of a memory cell having a storage element bit inserter for pre-setting the storage element of the memory cell to a high logic state.

As illustrated in FIG. 3, the output of a row write port 16 of a given row 12 is coupled to the bit input of an alternative memory cell 10 and, though not shown in FIG. 3, memory cells 10 of all other columns 14 of that row 12. Row write port 16 has the structure described above with respect to FIG. 2. Memory cell 10 includes a storage element 28, a bit write port 30, a bit read port 32, and a storage element bit inserter 50.

Bit write port 30 may be of any suitable design, but for illustrative purposes is as described above with respect to FIG. 2. Bit read port 32 and storage element 28 may similarly be as described above with respect to FIG. 2.

Storage element bit inserter 50 includes a PFET 52, the gate terminal of which is coupled to a control signal 54, which is one of the storage element bit inserter control signals 26 of this embodiment. Though not shown in FIG. 2, that same control signal 54 is coupled to the storage element bit inserter 50 of all other rows 12 of that column 14. The source terminal of PFET 52 is coupled to a reference supply voltage ($V_{DD}$), and the drain terminal is coupled to storage element 28. Thus, asserting control signal 54 sets storage element 28 to $V_{DD}$, which represents a high logic level or binary "1".

Figure 4:
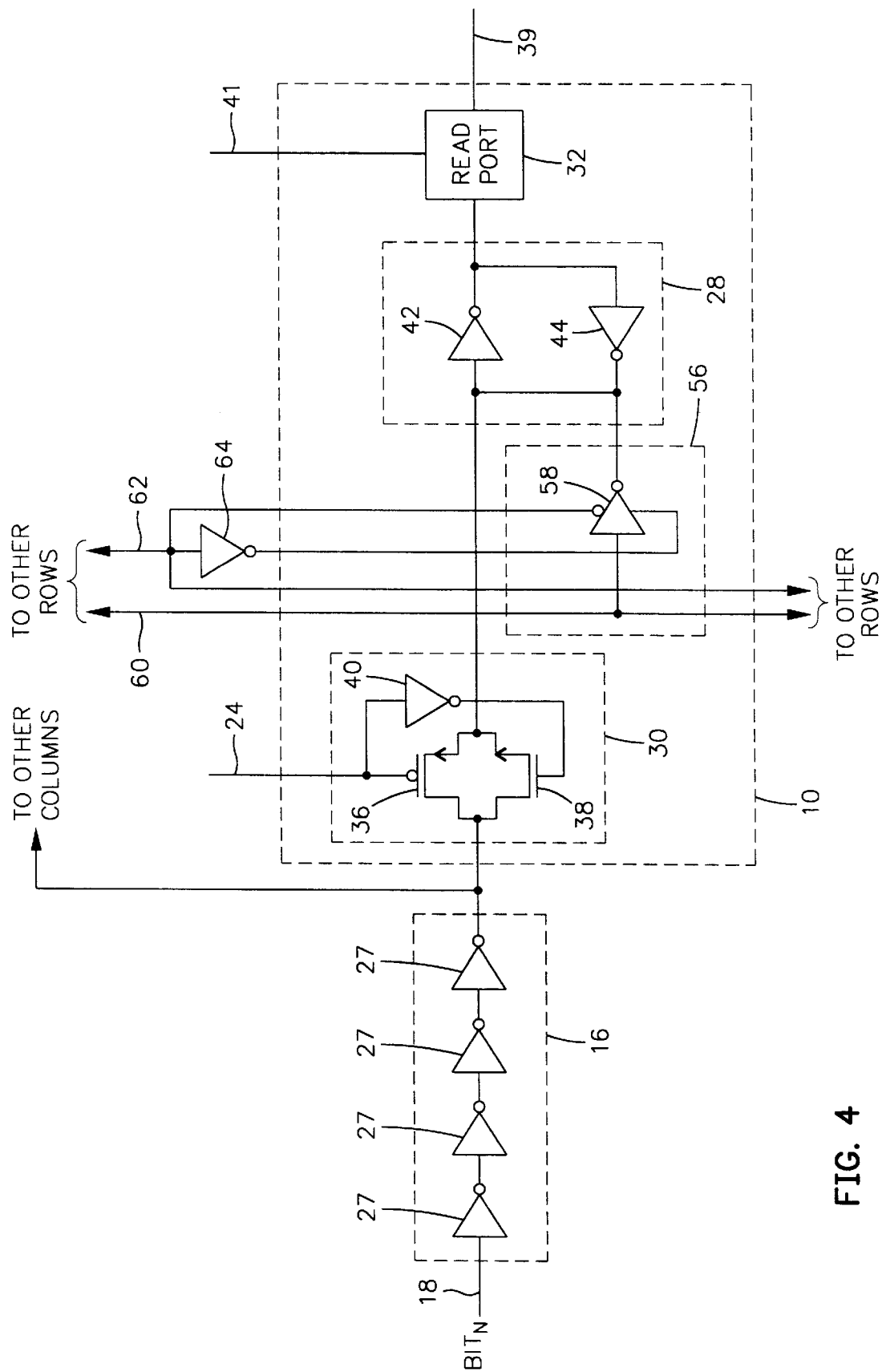
FIG. 4 is a schematic diagram of a memory cell having a tri-state storage element bit inserter for selectably setting the storage element of the memory cell to either a high or low logic state.

As illustrated in FIG. 4, the output of a row write port 16 of a given row 12 is coupled to the bit input of another alternative memory cell 10 and, though not shown in FIG. 4, memory cells 10 of all other columns 14 of that row 12. Row write port 16 has the structure described above with respect to FIGS. 2 and 3.

Memory cell 10 includes a storage element 28, a bit write port 30, a bit read port 32, and a storage element bit inserter 56.

Bit write port 30 may be of any suitable design, but for illustrative purposes is as described above with respect to FIGS. 2 and 3. Bit read port 32 and storage element 28 may similarly be as described above with respect to FIGS. 2 and 3.

Storage element bit inserter 56 is a tri-state circuit that allows selection of either a high or low logic level. Storage element bit inserter 56 includes a tri-state inverter 58. The data input of tri-state inverter 58 is coupled to a control signal 60. The output of tri-state inverter 58 is coupled to storage element 28. The tri-state inputs of tri-state inverter 58 are respectively coupled to a control signal 62 and, via an inverter 64, its complement. Control signals 60 and 62 are the storage element bit inserter control signals 26 of this embodiment. Though not shown in FIG. 4, control signals 60 and 62 are coupled in a like manner to the storage element bit inserters 56 of all other rows 12 of that column 14. Thus, asserting control signal 62 sets storage element 28 to either $V_{DD}$, which represents a high logic level or binary "1", or ground, which represents a low logic level or binary "0", depending upon the state or logic level of control signal 60.

Figure 5:
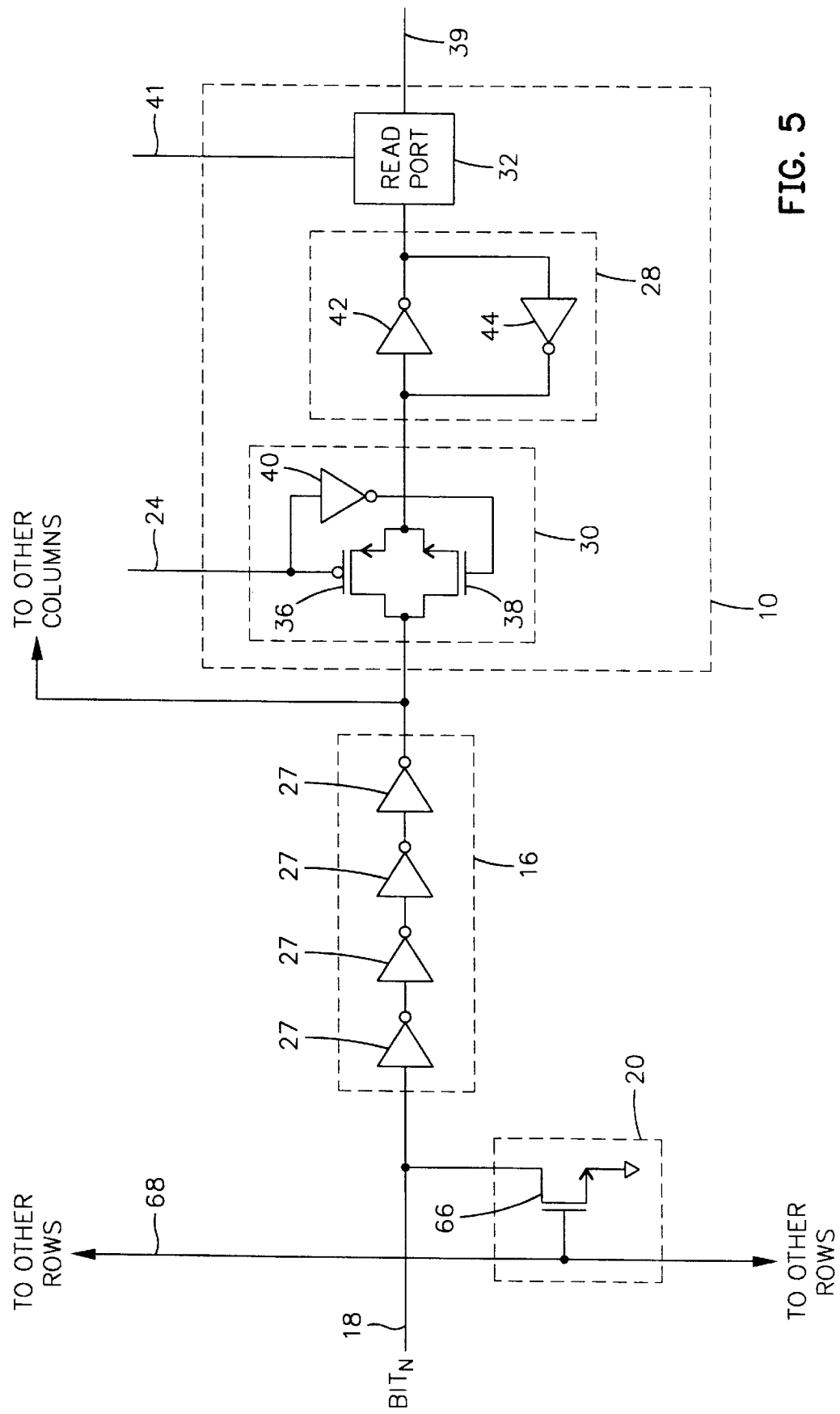
FIG. 5 is a schematic diagram of a row bit inserter coupled via a row write port to a memory cell for pre-setting a row write port input to a low logic state.

As illustrated in FIG. 5, the output of a row bit inserter 20 of a given row 12 is coupled to the input of a row write port 16, the output of which is in turn coupled to the bit input of a memory cell 10. Row bit inserter 20 includes a NFET 66, the gate terminal of which is coupled to a control signal 68, which is one of the row bit inserter control signals 22 of this embodiment. Though not shown in FIG. 5, control signal 68 is also coupled to the row bit inserter 20 of all other rows 12. The source terminal of NFET 66 is coupled to ground, and the drain terminal is coupled to the input of row write port 16. Thus, asserting control signal 68 sets the input of row write port 16 to ground, which represents a low logic level or binary "0".

Memory cell 10 includes a storage element 28, a bit write port 30, and a bit read port 32, all of which may be as described above with respect to FIGS. 2–4. Memory cell 10 may alternatively be any of the alternative embodiments illustrated in FIGS. 2–4.

Figure 6:
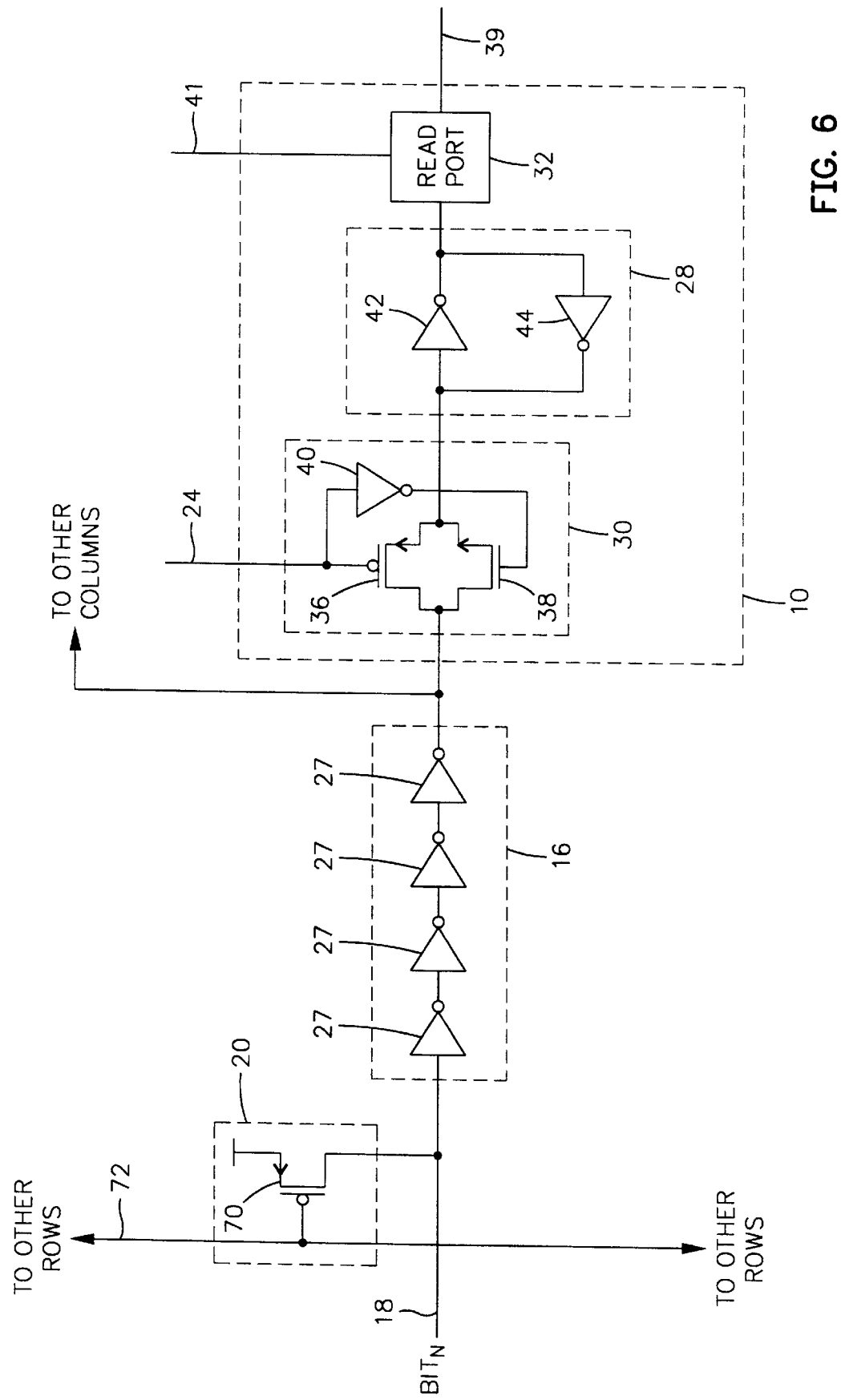
FIG. 6 is a schematic diagram of a row bit inserter coupled via a row write port to a memory cell for pre-setting a row write port input to a high logic state.

As illustrated in FIG. 6, the output of an alternative row bit inserter 20 of a given row 12 is coupled to the input of a row write port 16, the output of which is in turn coupled to the bit input of a memory cell 10. Row bit inserter 20 includes a PFET 70, the gate terminal of which is coupled to a control signal 72, which is one of the row bit inserter control signals 22 of this embodiment. Though not shown in FIG. 6, control signal 72 is also coupled to the row bit inserter 20 of all other rows 12. The source terminal of PFET 70 is coupled to a reference supply voltage $V_{DD}$, and the drain terminal is coupled to the input of row write port 16.

Thus, asserting control signal 72 sets the input of row write port 16 to $V_{DD}$, which represents a high logic level or binary "1".

Memory cell 10 includes a storage element 28, a bit write port 30, and a bit read port 32, all of which may be as described above with respect to FIGS. 2–4. Memory cell 10 may alternatively be any of the alternative embodiments illustrated in FIGS. 2–4.

Figure 7:
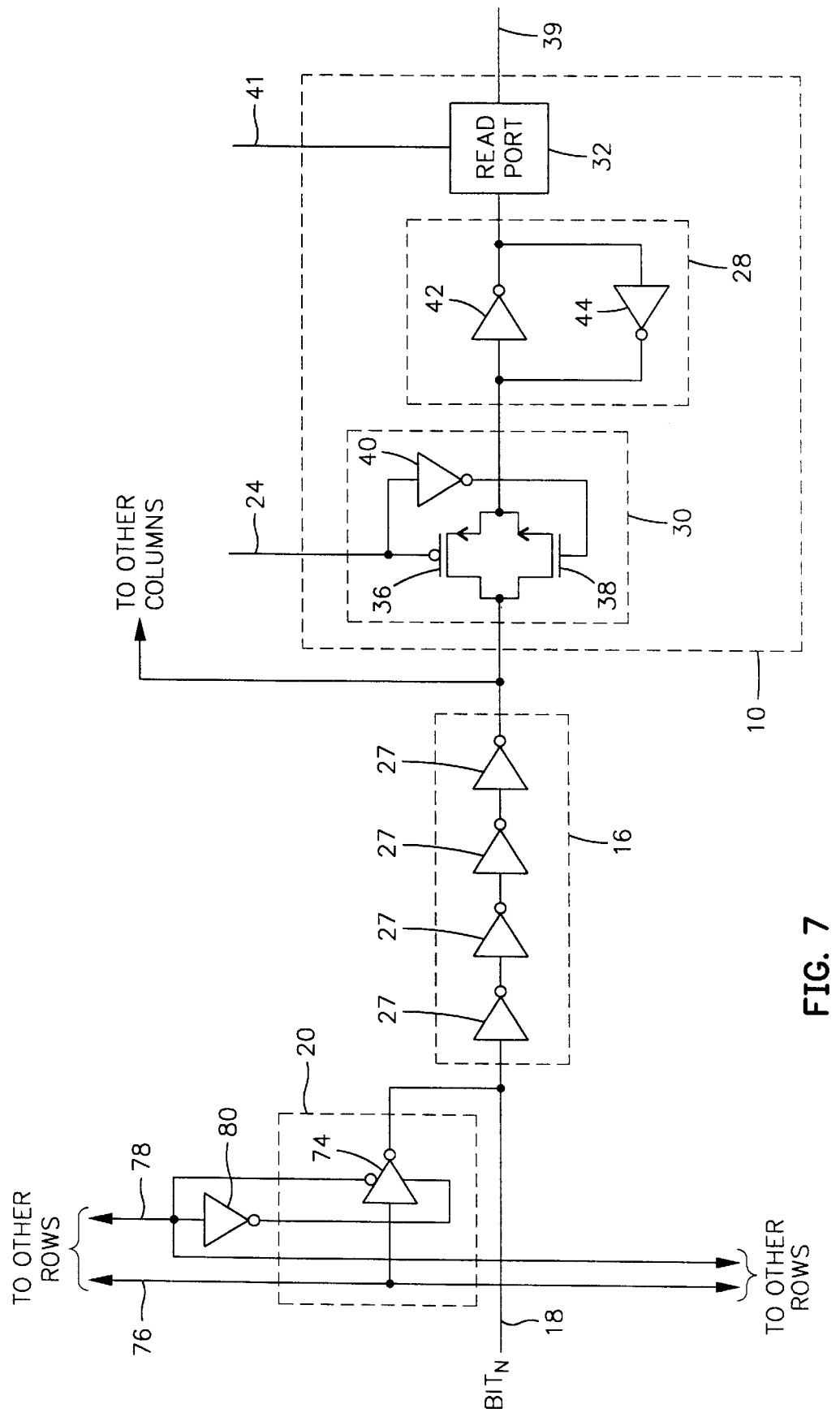
FIG. 7 is a schematic diagram of a tri-state row bit inserter coupled via a row write port to a memory cell for selectably pre-setting a row write port input to either a high or low logic state.

As illustrated in FIG. 7, the output of another alternative row bit inserter 20 of a given row 12 is coupled to the input of a row write port 16, the output of which is in turn coupled to the bit input of a memory cell 10. Row bit inserter 20 includes a tri-state inverter 74. The data input of tri-state inverter 74 is coupled to a control signal 76. The output of tri-state inverter 74 is coupled to the input of row write port 16. The tri-state inputs of tri-state inverter 74 are respectively coupled to a control signal 78 and, via an inverter 80, its complement. Control 20 signals 76 and 78 are the row bit inserter control signals 22 of this embodiment.

Though not shown in FIG. 7, control signals 76 and 78 are coupled in a like manner to the row bit inserters 20 of all other rows. Thus, asserting control signal 78 sets the input of row write port 16 to either $V_{DD}$, which represents a high logic level or binary "1", or ground, which represents a low logic level or binary "0", depending upon the state or logic level of control signal 76.

Memory cell 10 includes a storage element 28, a bit write port 30, and a bit read port 32, all of which may be as described above with respect to FIGS. 2–4. Memory cell 10 may alternatively be any of the alternative embodiments illustrated in FIGS. 2–4.

In summary, FIGS. 2–4 illustrate three exemplary embodiments of a storage element bit inserter 34, and FIGS. 5–7 illustrate three exemplary embodiments of a row bit inserter 20. Any suitable storage element bit inserter 34 or equivalent, including any of its three exemplary embodiments, may be included in a memory array, either by itself or in combination with any suitable row bit inserter 20 or equivalent, including any of its three exemplary embodiments. Conversely, any suitable row bit inserter 20 or equivalent, including any of its three exemplary embodiments, may be included in a memory array, either by itself or in combination with any suitable storage element bit inserter 34 or equivalent, including any of its three exemplary embodiments.

Figure 8:
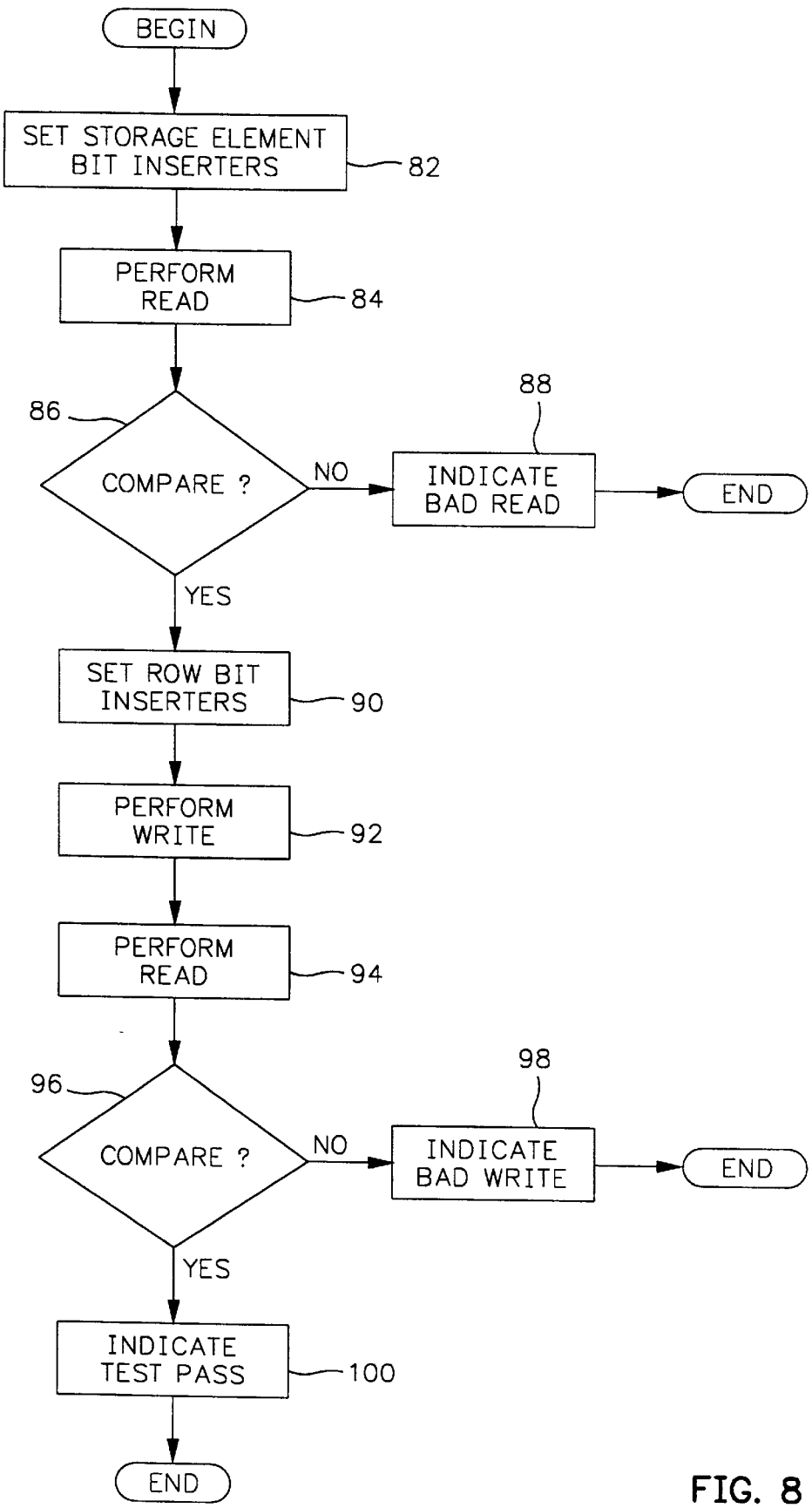
FIG. 8 is a flowchart illustrating a testing method.

FIG. 8 illustrates a method for testing the memory array using the above-described circuitry. At step 82, control signals 26 are used to set memory cells 10 to a predetermined logic level, as described above with respect to any of the embodiments illustrated in FIGS. 2–4. For example, in a memory array in which memory cells 10 are embodied as illustrated in FIG. 2, the logic level is low. In a memory array in which memory cells 10 are embodied as illustrated in FIG. 3, the logic level is high. In a memory array in which memory cells 10 are embodied as illustrated in FIG. 4, either a high or low logic level may be selected.

At step 84, a read operation is performed on memory cells 10. At step 86, the values read from memory cells 10 are compared to the values to which memory cells 10 were set. If the value read from a memory cell 10 does not match the value to which that memory cell 10 was set, it can be inferred that either storage element 28 or bit read port 32 (or both) of that memory cell 10 is not functioning properly, and an appropriate indication may be provided at step 88. If the values match, it can be inferred that both storage element 28 and bit read port 32 are functioning properly. If both are known to be functioning properly, then bit write port 30 and row write port 16 can be tested.

At step 90, control signals 22 are used to set the inputs of row write ports 16 to a predetermined logic level, as described above with respect to the embodiments illustrated in FIGS. 5–7. At step 92, a write operation is performed on memory cells 10. At step 94, a read operation is performed on memory cells 10. At step 96, the values read from memory cells 10 are compared to the values written to memory cells 10. If the value read from a memory cell 10 does not match the value to which that memory cell 10 was set, it can be inferred that either bit write port 30 or row write port 16 is not functioning properly, and an appropriate indication may be provided at step 98. If the values match, it can be inferred that bit write port 30 and row write port 16 are functioning properly, and an appropriate indication may be provided at step 100.

Columns 14 may be tested individually or in groups using the above-described method. The columns may be likened to data words. Thus, the invention may be conceptualized as testing a memory array on a word basis rather than on a bit basis. The method provides some of the advantages of conventional built-in self-test (BIST) in that the memory array includes integral structural elements that affect each and every bit during testing. In the present invention the testing is on a word basis, however, and not on a bit basis as in BIST. Therefore, the present invention is faster and requires fewer such elements.

Other embodiments and modifications of the present invention will occur readily to those of ordinary skill in the art in view of these teachings. Therefore, this invention is to be limited only by the following claims, which include all such other embodiments and modifications when viewed in conjunction with the above specification and accompanying drawings.

What is claimed is:

1. A memory array, comprising:
an array of memory cells arranged in a plurality of rows and a plurality of columns, each row having a row write port coupled to each memory cell of said row, each memory cell having a bit storage element; and
a plurality of row bit inserters, one row bit inserter coupled to an input of the row write port of a row, each row bit inserter having an insertion control input coupled to said insertion control input of all other row bit inserters.

2. The memory array claimed in claim 1, wherein each row bit inserter includes a transistor for setting said input of a row write port to a voltage level representing a high logic state.

3. The memory array claimed in claim 2, wherein said transistor is a P-channel field-effect transistor (PFET) for setting said input of a row write port to a supply voltage $V_{DD}$.

4. The memory array claimed in claim 1, wherein each row bit inserter includes a transistor for setting said input of a row write port to a voltage level representing a low logic state.

5. The memory array claimed in claim 4, wherein said transistor is a N-channel field-effect transistor (NFET) for setting said input of a row write port to ground.

6. The memory array claimed in claim 1, wherein said row bit inserter includes a tri-state inverter having a state control input and a data input for setting said input of a row write port to a voltage level representing a high logic state when said data input has a voltage representing a first logic state and for setting said input of a row write port to a voltage level representing a low logic state when said data input has voltage representing a second logic state.

7. The memory array recited in claim 1, further comprising a plurality of storage element bit inserters, one storage element bit inserter coupled to each bit storage element of each column, each storage element bit inserter of a column having an insertion control input coupled to said insertion control input of all other said storage element bit inserters of said column.

8. The memory array claimed in claim 7, wherein each storage element bit inserter includes a transistor for setting a bit storage element to a voltage level representing a high logic state.

9. The memory array claimed in claim 8, wherein said transistor is a P-channel field-effect transistor (PFET) for setting said bit storage element to a supply voltage $V_{DD}$.

10. The memory array claimed in claim 7, wherein said storage element bit inserter includes a transistor for setting said bit storage element to a voltage level representing a low logic state.

11. The memory array claimed in claim 10, wherein said transistor is a N-channel field-effect transistor (NFET) for setting said bit storage element to ground.

12. The memory array claimed in claim 7, wherein said storage element bit inserter includes a tri-state inverter having a state control input and a data input for setting a bit storage element to a voltage level representing a high logic state when said data input has a voltage representing a first logic state and for setting said bit storage element to a voltage level representing a low logic state when said data input has voltage representing a second logic state.

13. A memory array, comprising:
an array of memory cells arranged in a plurality of rows and a plurality of columns, each row having a row write port coupled to each memory cell of said row, each memory cell having a bit storage element; and
a plurality of storage element bit inserters, one storage element bit inserter coupled to each bit storage element of each column, each storage element bit inserter of a column having an insertion control input coupled to said insertion control input of all other said storage element bit inserters of said column and not coupled to an insertion control input of a storage element bit inserter of any other column.

14. The memory array claimed in claim 13, wherein each storage element bit inserter includes a transistor for setting a bit storage element to a voltage level representing a high logic state.

15. The memory array claimed in claim 14, wherein said transistor is a P-channel field-effect transistor (PFET) for setting said bit storage element to a supply voltage $V_{DD}$.

16. The memory array claimed in claim 13, wherein said storage element bit inserter includes a transistor for setting said bit storage element to a voltage level representing a low logic state.

17. The memory array claimed in claim 16, wherein said transistor is a N-channel field-effect transistor (NFET) for setting said bit storage element to ground.

18. The memory array claimed in claim 13, wherein said storage element bit inserter includes a tri-state inverter having a state control input and a data input for setting a bit storage element to a voltage level representing a high logic state when said data input has a voltage representing a first logic state and for setting said bit storage element to a voltage level representing a low logic state when said data input has voltage representing a second logic state.

19. A method for testing a memory array, said memory array comprising an array of memory cells arranged in a plurality of rows and a plurality of columns, each row having a row write port coupled to each memory cell of said row, each memory cell having a bit storage element, said memory array further comprising a plurality of row bit inserters, one row bit inserter coupled to an input of one row write port of a row, each row bit inserter having an insertion control input coupled to said insertion control input of all other row bit inserters, the method comprising the steps of:

setting, using said insertion control input of said row bit inserter, said input of each row write port to a voltage level representing a predetermined logic state;

performing a write operation to a column;

performing a read operation from said column to determine a logic state of each said bit storage element of said column; and comparing said logic state of each bit storage element of said column determined by said read operation to said predetermined logic state.

20. A method for testing a memory array, said memory array composing an array of memory cells arranged in a plurality of rows and a plurality of columns, each memory cell having a bit storage element, said memory array further a plurality of storage element bit inserters, one storage element bit inserter coupled to each bit storage element of each column of memory cells, each storage element bit inserter of a column having an insertion control input coupled to said insertion control input of all other said storage element bit inserters of said column, the method comprising the steps of:

setting said insertion control inputs of said storage element bit inserter to produce a voltage level representing a predetermined logic state at each bit storage element of each memory cell of a column to;

performing a read operation from said column to determine a logic state of each said bit storage element of said column; and comparing said logic state of each bit storage element of said column determined by said read operation to said predetermined logic state.

21. A method for testing a memory array, said memory array comprising an array of memory cells arranged in a plurality of rows and a plurality of columns, each row having a row read port and a row write port coupled to each memory cell of said row, each memory cell having a bit storage element, said memory array further comprising a plurality of row bit inserters, one row bit inserter coupled to an input of one row write port of a row, each row bit inserter having an insertion control input coupled to said insertion control input of all other row bit inserters, said memory array further comprising a plurality of storage element bit inserters, one storage element bit inserter coupled to each bit storage element of each column of memory cells, each storage element bit inserter of a column having an insertion control input coupled to said insertion control input of all other said storage element bit inserters of said column, the method comprising the steps of:

setting said insertion control inputs of said storage element bit inserter to produce a voltage level representing a predetermined logic state at each bit storage element of each memory cell of a column to;

performing a read operation from said column to determine a logic state of each said bit storage element of said column; comparing said logic state of each bit storage element of said column determined by said read operation to said predetermined logic state;

setting, using said insertion control input of said row bit inserter, said input of each row write port to a voltage level representing a predetermined logic state;

performing a write operation to a column;

performing a read operation from said column to determine a logic state of each said bit storage element of said column; and comparing said logic state of each bit storage element of said column determined by said read operation to said predetermined logic state.

\* \* \* \* \*